(12) United States Patent
Zahn et al.

(10) Patent No.: US 9,423,085 B2
(45) Date of Patent: Aug. 23, 2016

(54) BEAM SHAPING LIGHT EMITTING MODULE

(71) Applicant: KONINKLIJKE PHILIPS N.V., Eindhoven (NL)

(72) Inventors: Fritz Helmut Zahn, Geldrop (NL); Susanne Lina Goldbach, Eindhoven (NL); Martinus Petrus Joseph Peeters, Weert (NL); Rémy Cyrille Broersma, Eindhoven (NL); Aldegonda Lucia Weijers, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/362,156

(22) PCT Filed: Dec. 3, 2012

(86) PCT No.: PCT/IB2012/056910
§ 371 (c)(1),
(2) Date: Jun. 2, 2014

(87) PCT Pub. No.: WO2013/084132
PCT Pub. Date: Jun. 13, 2013

(65) Prior Publication Data
US 2014/0355239 A1  Dec. 4, 2014

Related U.S. Application Data

(60) Provisional application No. 61/567,670, filed on Dec. 7, 2011.

(51) Int. Cl.
*F21K 99/00* (2016.01)
*H01L 33/60* (2010.01)

(52) U.S. Cl.
CPC .. *F21K 9/56* (2013.01); *H01L 33/60* (2013.01)

(58) Field of Classification Search
CPC .................................. F21K 9/56; H01L 33/60
USPC ................. 362/84, 97.1–97.2, 510, 166, 169, 362/230–231, 239
See application file for complete search history.

(56) References Cited

U.S. PATENT DOCUMENTS 6,231,200 B1 * 5/2001 Shinohara et al. ............ 362/619
6,791,259 B1    9/2004 Stokes et al.
(Continued)

FOREIGN PATENT DOCUMENTS

DE    102007025092 A1   12/2008
WO      2004068182 A2    8/2004
(Continued)

*Primary Examiner* — Anne Hines
*Assistant Examiner* — Jose M Diaz

(57) ABSTRACT

There is provided a light emitting module (1) having at least one light emitting element (3) which is arranged to emit light of a primary wavelength, and a wavelength converting element (5) arranged at a distance from the at least one light emitting element (3). The wavelength converting element (5) is arranged to convert at least part of the light of a primary wavelength into light of a secondary wavelength. Further the module (1) comprises a first optical component (7) having surface structures (11) on a surface facing away from the light emitting element (3). Light rays incident on the first optical component (7) at small angles are reflected and light rays incident on the first optical component (7) at large angles are transmitted and bent towards a normal of the first optical component (7). The invention is advantageous in that it provides a compact and efficient light-directing module.

9 Claims, 2 Drawing Sheets

(56) References Cited

U.S. PATENT DOCUMENTS

| | | | |
|---|---|---|---|
| 6,871,982 B2* | 3/2005 | Holman et al. | 362/331 |
| 7,631,991 B2 | 12/2009 | Anderson et al. | |
| 7,926,999 B2* | 4/2011 | Miyashita et al. | 362/611 |
| 7,934,862 B2* | 5/2011 | Anandan | G02B 6/0036 362/231 |
| 8,096,693 B2* | 1/2012 | Taya | G02B 6/0038 362/330 |
| 8,348,489 B2* | 1/2013 | Holman et al. | 362/600 |
| 8,496,367 B2* | 7/2013 | Anandan | G02B 6/0036 362/231 |
| 8,651,722 B2* | 2/2014 | Yang | G02F 1/1336 349/68 |
| 2004/0080938 A1* | 4/2004 | Holman et al. | 362/231 |
| 2004/0145895 A1 | 7/2004 | Ouderkirk et al. | |
| 2006/0291203 A1* | 12/2006 | Anandan | G02B 6/0043 362/231 |
| 2007/0064407 A1 | 3/2007 | Huang et al. | |
| 2007/0221866 A1* | 9/2007 | Sohn et al. | 250/484.4 |
| 2008/0151540 A1* | 6/2008 | Noba | 362/231 |
| 2009/0225256 A1* | 9/2009 | Kim | 349/64 |
| 2010/0039797 A1* | 2/2010 | Shinkai et al. | 362/97.1 |
| 2010/0064177 A1 | 3/2010 | Li et al. | |
| 2010/0084678 A1 | 4/2010 | Streubel et al. | |
| 2010/0208495 A1* | 8/2010 | Park | 362/612 |
| 2010/0270569 A1 | 10/2010 | Grotsch et al. | |
| 2010/0321954 A1* | 12/2010 | Shinozaki et al. | 362/612 |
| 2011/0025190 A1 | 2/2011 | Jagt | |
| 2011/0025192 A1 | 2/2011 | Ansems et al. | |
| 2011/0149601 A1* | 6/2011 | Jang | 362/612 |
| 2011/0164431 A1* | 7/2011 | Anandan | G02B 6/0036 362/606 |
| 2011/0234942 A1* | 9/2011 | Nakagome | G02B 5/0226 349/64 |
| 2012/0061704 A1* | 3/2012 | Jeong et al. | 257/98 |
| 2012/0127757 A1* | 5/2012 | Konokawa et al. | 362/612 |
| 2012/0206674 A1* | 8/2012 | Weber | G02B 5/305 349/84 |

FOREIGN PATENT DOCUMENTS

| | | |
|---|---|---|
| WO | 2008040298 A1 | 4/2008 |
| WO | 2009041767 A2 | 4/2009 |
| WO | 2010035206 A1 | 4/2010 |
| WO | 2010064177 A1 | 6/2010 |
| WO | 2010122471 A2 | 10/2010 |

* cited by examiner

BEAM SHAPING LIGHT EMITTING MODULE

CROSS-REFERENCE TO PRIOR APPLICATIONS

This application is the U.S. National Phase application under 35 U.S.C. §371 of International Application No. PCT/IB2012/056910, filed on Dec. 3, 2012, which claims the benefit of [e.g., U.S. Provisional Patent Application No. or European Patent Application No.] 61/567,670, filed on Dec. 7, 2011. These applications are hereby incorporated by reference herein.

FIELD OF THE INVENTION

The present invention relates to the field of illumination devices. In particular, it relates to a light emitting module comprising a light emitting element and a wavelength converting element arranged at a distance from the light emitting element.

BACKGROUND OF THE INVENTION

White light illumination may be realized by using blue Light Emitting Diodes (LEDs) in combination with a wavelength converting layer, such as a phosphor layer, that absorbs part of the blue light and converts it to colours with a longer wavelength. In the output light the different wavelengths are combined, resulting in white light.

However, there are a number of problems associated with this approach. One problem stems from the fact that the output light from the wavelength converting layer will have different colour compositions in different directions. In particular, the output light emitted at small angles has typically a higher proportion of blue light compared to the light emitted at large angles which typically has a higher proportion of yellow light. This is sometimes referred to as the "yellow ring problem".

US2010064177A discloses a LED assembly which aims at solving the yellow ring problem without reducing the efficiency of the LED assembly. The assembly comprises a LED die, a phosphor layer, and a filter layer. The filter layer is developed in such a manner that light rays with a wavelength of about 400 nm to 500 nm, preferably of about 420 nm to 490 nm, emitted from the LED die are at least partially reflected depending on their emission angle to the normal on the filter layer.

The wavelength converting layer may be placed on top of the LED chip. However, in order to achieve higher efficiencies and less colour shifting due to thermal effects, the wavelength converting layer is often placed at a distance from, or remote from, the LED chip. As a result of the wavelength converting layer being located at a distance from the LED, the size of the wavelength converting layer is larger than the light emitting part of the LED. A drawback with LED light sources having a remote wavelength converting element is that the emitted light is more difficult to collimate with a compact system than light of smaller light sources such as white LEDs.

SUMMARY OF THE INVENTION

It is an object of the present invention to overcome or at least mitigate the problems discussed above, and to provide an improved light emitting module. In particular, it is an object to provide a compact and efficient light emitting module which directs the emitted light at the same time as it reduces the yellow ring problem.

According to the inventive concept, this and other objects are achieved by a light emitting module comprising at least one light emitting element which is arranged to emit light of a primary wavelength, each of the at least one light emitting element having a light emitting area; a wavelength converting element arranged at a distance from the at least one light emitting element of at least a width of the smallest light emitting area of the at least one light emitting element, the wavelength converting element being arranged to convert at least part of the light of a primary wavelength into light of a secondary wavelength; and a first optical component being positioned such that the wavelength converting element is located between the at least one light emitting element and the first optical component, wherein the first optical component has surface structures on a surface facing away from the at least one light emitting element, wherein the surface structures are arranged such that light rays incident on the first optical component at angles falling inside of a predetermined incidence cone centered about a normal of the first optical component are reflected, and light rays incident on the first optical component at angles falling outside of the predetermined incidence cone are at least partially transmitted and bent towards the normal to fall inside an emission cone which is centered about an optical axis of the light emitting module.

The predetermined incidence cone is an imaginary cone centered about a normal of the first optical component. The normal is to be interpreted as a normal of the first optical component at a point of incidence of a light ray. The predetermined cone defines, for each plane of incidence, a predetermined angle such that a light ray incident at an angle smaller than the predetermined angle is reflected by the first optical component, and a light ray incident at an angle larger than the predetermined angle is at least partially transmitted and bent by the first optical component. It is to be noted that for angles larger than the predetermined angle there is a transition interval of angles where light rays are partially transmitted and partially reflected at the surface structures. This is because the transition from reflection to transmission is a continuous transition.

The predetermined incidence cone may generally have any shape of the base or of the cross-section. The shape of the base or the cross-section is dependent on the geometry of the surface structures of the first optical component.

The emission cone is a cone which is centered about the optical axis of the light emitting module. The emission cone may generally have any shape of its cross-section and the shape is determined by the geometry of the first optical component and its surface structures. The emission cone corresponds to the shape of the beam of light which is output from the light emitting module.

The inventors have realized that by the provision of a first optical component having surface structures, light emitted from a module is directed in a compact and efficient way. More precisely, the first optical component redirects part of the light back towards the wavelength converting element where it gets a second chance of being absorbed and converted or scattered. In particular, light that falls in on the first optical component inside of the predetermined incidence cone, i.e., light that falls in on the first optical component at a small angle, is reflected and hence redirected towards the wavelength converting element. Such light is typically of the primary wavelength. In this way, since part of the light of a primary wavelength is recycled by the wavelength converting element, a wavelength converting layer of the wavelength converting element may be made thinner or with a lower concentration of the wavelength converting material. As a result, the efficiency of the light emitting module is improved since the light transmission increases when the wavelength converting layer is made thinner. Moreover, the yellow ring problem is solved or mitigated since the proportion of light of a primary wavelength in the output light emitted by the light emitting module at small angles is reduced.

Further, due to the surface structures of the first optical component, light beams incident on the first optical component at angles falling outside of the incidence cone, i.e., at large angles are transmitted and bent towards the normal to fall inside an emission cone. Accordingly, the first optical component serves to direct the emitted light and to restrict the emitted light to an emission cone. The first optical component may have about the same size as the wavelength converting element. Hence, the light emitting module may be made of compact size. This is in contrast to traditional light directing modules or spot-lights where collimating optics is used to restrict the output light. Due to the law of conservation of etendue, such collimating optics needs to have a diameter which is significantly larger than the wavelength converting element.

The invention is further advantageous in that less or no scattering particles have to be added to the wavelength converting element. Usually, in order to reduce the yellow ring problem, scattering particles are added to the wavelength converting element in order to reduce the transmission of light of a primary wavelength in a forward direction. As explained above, by provision of the first optical element, the proportion of light of primary wavelength in a forward direction is decreased and hence the need for additional scattering particles is reduced.

Further, since the wavelength converting layer may be made thinner, the cost for wavelength converting material may be reduced.

Still further, since the first optical component cuts off the light that is emitted at shearing ray angles to direct the beam to an emission cone, glare is reduced.

The surface structures may be arranged so that the first optical component reflects light rays of ambient light incident on the first optical component on a side facing away from the light emitting element at angles falling outside of the emission cone, such that the wavelength converting element is invisible from viewing angles falling outside of the emission cone. The wavelength converting element may otherwise have an undesired appearance when the light emitting module is turned off. For example, the wavelength converting element may have a yellow appearance in case it comprises phosphor such as YAG:Ce. It is thus advantageous that the wavelength converting element cannot be seen from oblique viewing angles.

By varying the shape of the surface structures, the shape of the beam of output light may be varied. In one embodiment, the surface structures comprise a plurality of structures, wherein each structure extends across the first optical component in a first direction and wherein a cross-section of each structure has a constant shape along the first direction. For example, the plurality of structures may comprise ridges extending in the first direction.

The light emitting module may further comprise a second optical component positioned on a side of the first optical component facing away from the wavelength converting element, wherein the second optical component has surface structures on a surface facing away from the wavelength converting element. This is advantageous in that the number of possible variations of the shape of the output beam is increased by having more than one optical component.

For example, the surface structures of the first and second optical components may comprise ridges extending in a first direction and a second direction, respectively, and wherein the ridges of the first and second optical components are arranged at an angle relatively each other. By varying the angle between the first and second optical components, the shape of the output beam, that is, the shape of the emission cone may be varied. For example, in case the ridges of the two optical components are arranged at a right angle relatively each other, an output beam having an essentially squared cross-section may be obtained.

The wavelength converting element may have a curved shape and the first optical component may be arranged on the wavelength converting element. Thus, it is also possible to confine the angles of the light rays in the output beam when the wavelength converting element has a curved shape.

The surface structures may further comprise a plurality of structures being arranged in a two-dimensional pattern. For example, the plurality of structures may comprise pyramid structures or prism structures. This is advantageous in that the shape of the output beam may be varied by using one optical component only.

In order to further increase the efficiency of the light emitting module, the surface structures may further be arranged such that a reflected light ray originating from a light ray incident on the first optical component at an angle falling inside of the incidence cone is shifted a distance with respect to the incident light ray, wherein the distance with respect to the incident light ray is larger than a geometrical extent of the light emitting area of at least one of the light emitting elements. With such an arrangement, the reflected light rays are not directed back to the light emitting area of the light emitting element where they would be partially absorbed. Thereby the efficiency is increased. For example, the smallest geometrical dimension of the surface structures may be larger than the geometrical extent of the light emitting area of at least one of the light emitting elements.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION OF THE EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
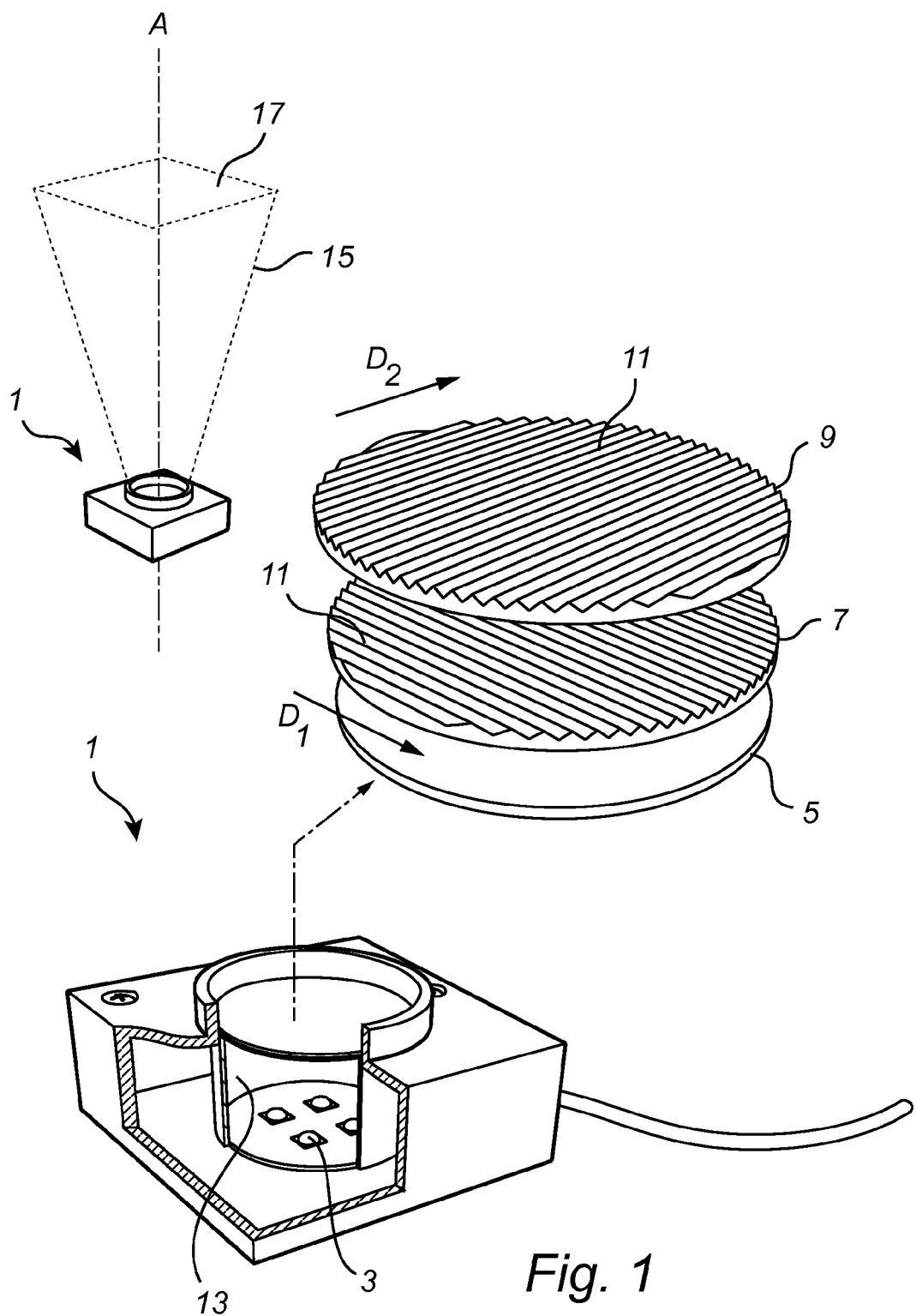
FIG. 1 is a perspective and partly exploded view of a light emitting module according to an embodiment of the invention. Further, a beam shape provided by the light emitting module is illustrated.

FIG. 1 illustrates a light emitting module 1. The light emitting module 1 comprises at least one light emitting element 3. In the illustrated example, four light emitting elements 3 are shown. The light emitting module 1 further comprises a wavelength converting element 5 which is arranged at a distance from the light emitting elements 3. A first optical element 7 is provided on top of or at a small distance from the side of the light converting element 5 facing away from the light emitting elements 3. Accordingly, the wavelength converting element 5 is positioned between the light emitting elements 3 and the first optical element 7. Further, a second optical element 9 may be provided on a side of the first optical component 7 facing away from the wavelength converting element 5.

The illustrated light emitting module 1 is a down-light module. However, the invention is not limited to down-light modules but may also be used in other types of light modules such as LED-light bulbs and LED tube luminescent-lights (LED TL-light).

The light emitting elements 3 are arranged to emit light of a primary wavelength. Each of the light emitting elements 3 has a light emitting area. For example, the light emitting elements 3 may be LEDs. The primary wavelength may be a wavelength in the blue part of the colour spectrum. In the illustrated example, the light emitting elements 3 are arranged at the bottom of a box 13 of the light emitting module 1. The box 13 may have walls and a bottom plate which have a reflecting surface such that light incident on the walls and the bottom plate are (difusively or specularly) reflected.

The wavelength converting element 5 is arranged to convert at least part of the light of primary wavelength emitted by the light emitting elements 3 into light of a secondary wavelength. The secondary wavelength typically corresponds to a colour having a longer wavelength than the primary wavelength. For example, the secondary wavelength may correspond to green, yellow, and/or red light. As a result, the light which has passed through the wavelength converting element 5 is a mixture of light having the primary wavelength and the secondary wavelength. Thus, in the output light the different wavelengths are combined such that the resulting light, preferably, is perceived as white light.

The wavelength converting element 5 may be a phosphor component such as a phosphor layer arranged on a carrier. In principle, wavelength converting element 5 may be arranged on top of the light emitting elements 3. However, by arranging the wavelength converting element 5 at a distance from the light emitting elements 3 several advantages may be achieved, such as higher efficiencies and less colour shifting due to thermal effects. The distance may for example be at least the width of the smallest light emitting area of the light emitting elements 3. When the wavelength converting element 5 is arranged at a distance from the light emitting element 3, it is sometimes referred to as a remote component. In particular, in case of the wavelength converting element 5 being a phosphor layer on a carrier, the carrier may be referred to as a remote phosphor component. The size of the wavelength converting element 5 is typically larger than the light emitting areas of the light emitting elements 3. This is due to several reasons. Firstly, the wavelength converting element 5 is arranged at a distance from the light emitting elements 3 from which the light diverges and, hence, the wavelength converting element 5 is preferably larger than the light emitting area of the light emitting elements 3. Secondly, in case the light emitting module 1 comprises several light emitting elements 3, the wavelength converting element 5 preferably covers all of the light emitting elements 3.

Light that comes out from the wavelength converting element 5 is essentially diffuse. This is because wavelength converting particles, such as phosphor particles, in the wavelength converting element 5 emit light into all directions. The first and second optical components 7 and 9, which may be in the form of foils, are provided to shape the light beam of the light emitting module 1. This may be achieved by the first and second optical components 7 and 9 having surface structures 11 on a surface facing away from the light emitting elements 3. The size of the first and second optical components 7 and 9 in a lateral direction may be equal or comparable to the size of the wavelength converting element 5. In this way, the light emitting module 1 becomes a compact spotlight.

The illustrated surface structures 11 of the first optical component 7 comprise a plurality of surface structures which each extends across the first optical component 7 in a first direction D1. Similarly, the surface structures 11 of the second optical component 9 comprise a plurality of surface structures which each extends across the second optical component 9 in a second direction D2. The cross-section of the surface structures 11 has a constant shape along the first and second directions, respectively. Here, the structures 11 are in the form of ridges or a roof structure extending in the first and second directions D1 and D2, respectively. The structures 11 may be less than 100 μm in height. The top angle of the ridges or the roof structures may be about 90°.

In alternative embodiments, the structures may be bigger in size than the light emitting areas of the light emitting elements 3. For example, the smallest geometrical dimension of the surface structures 11 may be larger than the geometrical extent of at least one of the light emitting elements 3. If so, the surface structures 11 are arranged such that an incident light ray that has been reflected by the surface structures 11 is shifted a distance with respect to the incident light ray. Moreover, the distance which the reflected ray is shifted is larger than the geometrical extent of the light emitting part of the light emitting element 1. As a consequence, the reflected light ray is not directed back to the emitting light emitting element 3 where it may be partially absorbed. This is advantageous in that the efficiency of the light emitting module 1 is improved.

The surface structures 11 of the first and second optical components 7 and 9 may be arranged at an angle relatively each other. More specifically, the ridges extending in a first and second direction D1 and D2, respectively, may be arranged at an angle relatively each other. For example, the angle may be 90°. With such a set-up, the originally diffuse, Lambertian-shaped, illumination from the wavelength converting element 5 is confined to a beam of ±20°.

When in use, the light that comes out of the light emitting element 1 is confined to a cone-shaped beam 15 being centered about an optical axis A of the module. The cone-shaped beam 15 may be referred to as an emission cone. By varying the angle between the surface structures of the first and second optical components 7 and 9, respectively, the shape of the light cone 15 may be varied. More particularly, the shape of the cross-section 17 of the light cone 15, or the eccentricity of the light cone 15, may be varied by varying this angle. This cross-section 17 or eccentricity corresponds to the shape of an illumination spot caused by the light emitting module 1 when directed towards a surface. For example, by arranging the ridges of the first and second optical components 7 and 9 at a right angle relatively each other, the cross-section 17 of the light cone 15 will have a square-like shape. Upon increasing and decreasing the angle from this position, the dimensions of the cross-section 17 vary such that the cross-section 17 increases in one direction. In one embodiment, at least one of the first and second optical components 7 and 9 may be rotatably mounted. If so, a user of the light emitting module 1 may adjust the shape of the beam of by rotating at least one of the first and second optical components 7 and 9.

The function of the light emitting module 1, and in particular, the optical element 7 will now be described with reference to FIG. 1 and FIG. 2.

The light emitting elements 3 emit light of a primary wavelength. When passing through the wavelength converting element 5, part of the emitted light is converted into light of a secondary wavelength. The part of the emitted light that is converted into a secondary wavelength is re-emitted into all directions by the wavelength converting element 5. As a result, the light of a primary wavelength coming out of the wavelength converting element 5 typically has a direction which is close to or within a small angle to the optical axis A of the light emitting module 1. Accordingly, the proportion of light of primary wavelength in the light that falls in on the first optical component 7 at a low angle is higher than the proportion of light of primary wavelength in the light that falls in at large angles. Similarly, the light of secondary wavelength coming out of the wavelength converting element 5 has a random direction and hence typically falls in on the first optical component 7 at larger angles than the light of primary wavelength. As a result, the percentage of light of primary wavelength that is reflected by the first optical component 7 is higher than the percentage of the converted light that is reflected.

Figure 2:
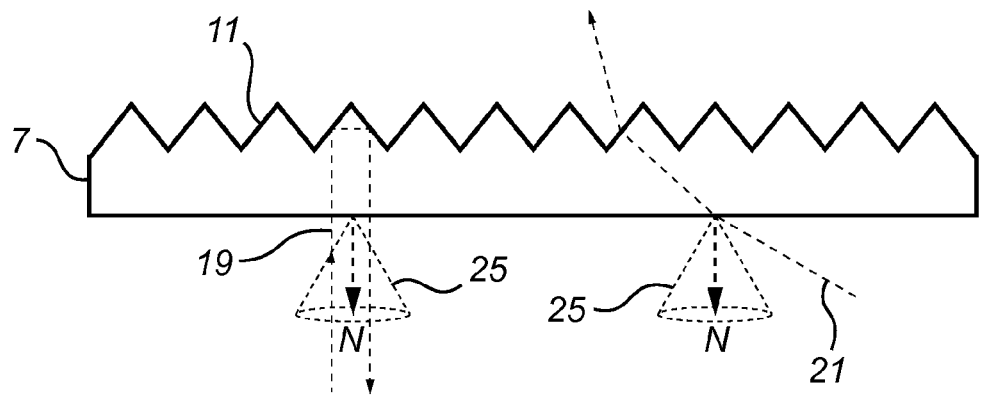
FIG. 2 is an illustration of the passage of light rays through an optical component according to embodiments of the invention.

As illustrated in FIG. 2, a light ray 19 incident on the first optical component 7 at an angle which is smaller than a predetermined angle with respect to a normal N of the first optical component 7 is reflected by the surface structures 11. The normal N is the normal of the surface of the first optical component 7 at the point where the light ray 19 enters the first optical component 7. In this example, the normal N corresponds to the optical axis A of the light emitting module 1. The predetermined angle corresponds to the largest angle of incidence where the incident light ray 19 is subject to total reflection by the surface structures 11. The predetermined angle is thus dependent on the shape of the surface structures 11, and on the index of retraction of the material forming the first optical component 7, such as glass, quartz, PMMA, PC, etc.

Further, a light ray 21 having an angle of incidence which is larger than the predetermined angle relatively the normal N is transmitted and bent towards the normal N. This is due to differences in refractive indices between the first optical component 7 and the ambient air.

More generally, taking into account that the first optical component 7 is a three-dimensional object and that light may fall in on the first optical component 7 from any angle, the predetermined angle discussed above is replaced by a predetermined incidence cone 25 being centered about the normal N. More precisely, light rays incident on the first optical component 7 that falls inside of the predetermined incidence cone 25 are reflected by the first optical component 7. Further, light rays incident on the first optical component 7 that falls outside of the predetermined incidence cone 25 are at least partially transmitted and bent towards the normal N. It is noted that the predetermined incidence cone 25 must not necessarily have a circular cross-section, instead the cross-section may have any shape. The shape of the cross-section of the predetermined incidence cone 25 is related to the shape of the structures of the first optical component 7. Particularly, the shape of the predetermined incidence cone 25 is related to the angles of incidence at which a light ray is subject to total reflection by the structures 11.

As discussed above, the percentage of light of primary wavelength that is reflected by the first optical component 7 is higher than the percentage of the converted light that is reflected. The reflected light is redirected back to the wavelength conversion element 5 where it is reabsorbed and converted or scattered. Hence, part of the light of primary wavelength is re-cycled, that is, it gets a second chance for absorption and conversion by the wavelength conversion element 5. This is advantageous in that a thinner or less concentrated layer of wavelength conversion particles, such as phosphor particles, may be used. This implies in turn that the light efficiency is improved since the light transmission is increased due to the thinner layer of wavelength conversion particles.

The second optical component 9 has a similar functionality as the first optical component 7. In particular, the second optical component 9 may also be associated with a predetermined incidence cone centered about a normal of the second optical component 9. It is to be noted that the predetermined incidence cone associated with the second optical component 9 may have a different shape and/or orientation relatively the predetermined incidence cone being associated with the first optical component 7. Light rays having an angle of incidence falling inside of the predetermined incidence cone with respect to a normal of the second optical component 9 are reflected by the second optical component 9 and light rays having an angle of incidence falling outside of the predetermined incidence cone are transmitted and bent towards the normal.

As a result of the light being bent towards the normal N, the light is confined to fall into a cone, such as cone 15 of FIG. 1, which is centered about the optical axis A of the module 1. The cone 15 may be referred to as an emission cone 15. Thus, the first optical component 7 and the second optical component 9 with their surface structures 11 shape the beam and focus it to a spotlight.

As described above, when the light emitting module 1 is in use, i.e., being in an on state, it emits light being confined to a light cone 15. Another advantage achieved by the light emitting module 1 is related to its appearance when it is in an off-state. More precisely, conventional light emitting modules having a wavelength converting element comprising phosphor have an unwanted yellow appearance when the light emitting module is in an off-state. By provision of at least one optical component 7 and/or 9 having surface structures 11, the yellow appearance in an off-state may be reduced.

The surface structures 11 of the first optical component 7 or of the second optical component 9 (if present) may be arranged such that light rays of ambient light incident on the first optical component are reflected by the first optical component if the angle of incidence of the light rays falls outside of a the light cone 15 centered about the optical axis of the light emitting module 1. Thus, for viewing angles corresponding to such angles of incidence, the wavelength converting element 5 is invisible. In more detail, the light rays of ambient light are reflected at the backside of the optical component(s), that is, at the side of the optical component(s) that does not have surface structures. The reflection thus does not take place at the surface structures 11. However, the surface structures 11 are the cause why the rays hit the backside of the component at angles at which they are reflected.

Looked at it differently, light rays coming from the wavelength converting element 5 are confined to fall into the emission cone 15 as previously explained. Accordingly, no light rays originating from the wavelength converting element 5 are emitted outside of the emission cone 15 and hence the wavelength converting element 5 is invisible when viewed from outside of the emission cone 15. Moreover, due to fundamental optical laws, the optical light paths can be reversed. Therefore, it is impossible for rays of ambient light that falls in from outside of the emission cone 15 to travel to the wavelength converting element 5.

As discussed above with respect to the incidence cone, there is a transition interval of angles of incidence where light is partially transmitted and partially reflected by the first optical element. For viewing angles corresponding to such a transition interval, the wavelength converting element 5 is visible but not as obvious as from viewing angles inside of the emission cone 15.

In the embodiment described with respect to FIG. 1, the light emitting module 1 comprises two optical components 7 and 9 which are arranged at an angle relatively each other. Alternatively, the light emitting module 1 may comprise a single optical component. Yet alternatively, the light emitting module 1 may comprise more than two optical components. Further, there are many possible embodiments regarding the shape and the arrangement of the structures 11 of the optical components. The important point is that the structures 11 are arranged such that light rays incident on the optical component(s) at small angles, i.e., angles falling inside of a predetermined incidence cone 25, are reflected, and that light rays incident at large angles, i.e., falling outside of the predetermined incidence cone 25, are at least partially transmitted and bent towards the normal of the optical component(s).

Figure 3:
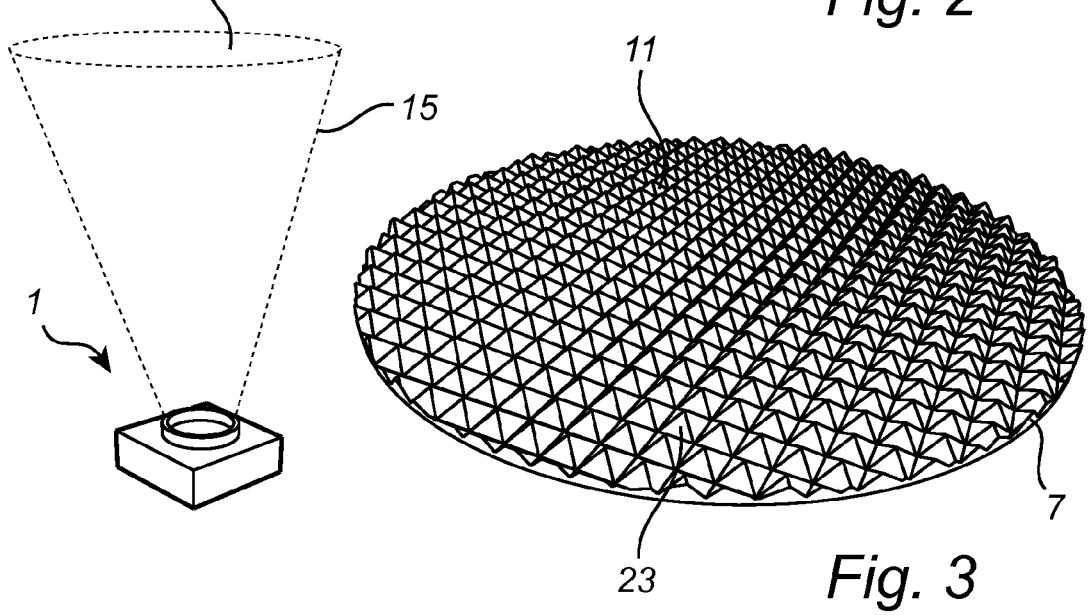
FIG. 3 is a perspective view of an optical component according to an embodiment of the invention, and a beam shape provided by a light emitting module comprising such an optical component.

FIG. 3 illustrates a first optical component 7 having surface structures 11. The first optical component 7 is intended to be included in a light emitting module 1 as a first and single optical component. The surface structures 11 are formed on the side of the first optical component 7 which, in use, faces away from the light emitting element 3.

The structures 11 comprise a plurality of three-dimensional structures 23. The three-dimensional structures 23 are arranged in a two-dimensional pattern. In the illustrated example, the three-dimensional structures 23 are arranged in a regular two-dimensional grid pattern. However, other types of two-dimensional patterns, such as symmetric patterns, circular-symmetric patterns or non-symmetric patterns, are also possible. Further, the structures 23 may be arranged in a one-dimensional pattern such as the ridges of the first optical element of FIG. 1.

The illustrated three-dimensional structures 23 are in the form of pyramids. Alternatively, the three-dimensional structures 23 may have other types of prismatic or non-prismatic shapes. Further, structures 23 of different shape may be combined. For example, structures 23 having different shapes may be provided at different parts of the first optical component 7.

By varying the shape of the structures 23, the emission cone 15, i.e., the directed light coming out of the light emitting module 1, will have different shapes. For example, the cross-section 17 of the emission cone corresponding to an illumination spot may get a circular, an elliptical, or a rectangular shape as previously described. With the surface structures of FIG. 3, the light emitting module 1 is a spotlight which directs the light to a beam angle of about ±40° with respect to the optical axis A of the light emitting module 1. If a single optical component 7 having ridge-structures is used, the surface structures 11 only bend the light in one direction resulting in an elliptical illumination spot.

Figure 4:
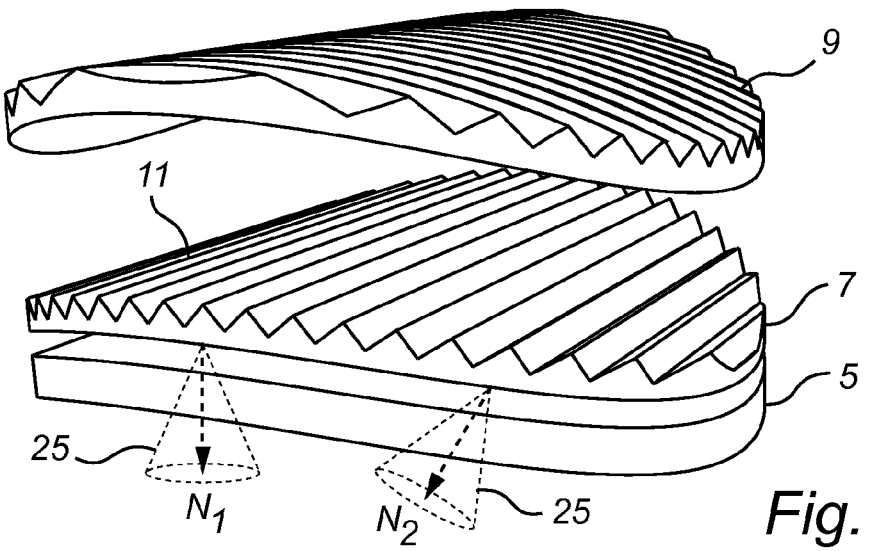
FIG. 4 is a perspective and exploded view of a wavelength converting element and a first and a second optical component according to an embodiment of the invention.

FIG. 4 illustrates a wavelength converting element 5 and a first and second optical component 7 and 9 which are intended to be part of a light emitting module 1. In contrast to the embodiments of FIG. 1 and FIG. 3, the wavelength converting element 5 has a curved shape. The first and second optical components 7 and 9 are arranged on top of and in contact with the wavelength converting element 5. Hence, the first and second optical components 7 and 9 also have a curved shape.

The optical components 7 and 9 have surface structures on a side facing away from the wavelength converting element 5. The surface structures 11 may comprise a plurality of surface structures according to what has previously been described with respect to FIG. 1 and FIG. 3. Here, the surface structures 11 comprise ridges extending across the first and second optical component 7 and 9, respectively.

In each point on the surface of the first optical component 7 facing the wavelength converting element a normal, such as normals N1 and N2, may be defined. Since the first optical component has a curved surface, the normals defined in different point will in this case be non-parallel. For example, the illustrated normals N1 and N2 are non-parallel. A predetermined incidence cone 25 may be centered about the normal in each point on the surface of the first optical component 7. In the illustrated example, a predetermined incidence cone 25 is centered about the normals N1 and N2.

Due to the arrangement of the surface structures 11, a light ray incident on the first optical component 7 will be reflected or transmitted and bent depending on if it falls inside or outside of an incidence cone. More precisely, a light ray incident on the first optical component 7 at a point having a normal N1 and at an angle falling inside of the incidence cone 25 centered about the normal N1 are reflected. Further, a light ray incident at a point having a normal N1 and at an angle outside of the incidence cone 25 are transmitted and bent towards the normal N1. Similarly, if the light ray is incident at a point having a normal N2, the light ray is reflected if it falls within the incidence cone centered about the normal N2 and otherwise the light ray is transmitted and bent towards the normal N2.

It is to be understood that an embodiment with a curved wavelength converting element 5 and only one first optical component may be used.

The person skilled in the art realizes that the present invention by no means is limited to the preferred embodiments described above. On the contrary, many modifications and variations are possible within the scope of the appended claims. For example, the surface structures may have other shapes than discussed herein and there may be more than two optical components.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. Light emitting module comprising:
    at least one light emitting element which is arranged to emit light of a primary wavelength, each of the at least one light emitting element having a light emitting area;
    a wavelength converting element arranged at a distance from the at least one light emitting element of at least a width of the smallest light emitting area of the at least one light emitting element, the wavelength converting element being arranged to convert at least part of the light of the primary wavelength into light of a secondary wavelength; and a first optical component being positioned such that the wavelength converting element is located between the at least one light emitting element and the first optical component, wherein the first optical component has surface structures on a surface facing away from the at least one light emitting element, wherein the surface structures are arranged such that light rays incident on the first optical component at angles falling inside of a predetermined incidence cone centered about a normal of the first optical component are reflected, and light rays incident on the first optical component at angles falling outside of the predetermined incidence cone are at least partially transmitted and bent towards the normal to fall inside an emission cone which is centered about an optical axis of the light emitting module, the light emitting module further comprising a second optical component positioned on a side of the first optical component facing away from the wavelength converting element, wherein the second optical component has surface structures on a surface facing away from the wavelength converting element, and wherein the surface structures of the first and second optical components comprise ridges extending in a first direction and a second direction, respectively, wherein the ridges of the first and second optical components are arranged at an angle relative to each other, wherein said at least one light emitting element is arranged substantially perpendicular to said surface of said first optical component, and wherein the first optical component, the wavelength converting element and the at least one light emitting element are configured such that the percentage of the light of the primary wavelength reflected by the first optical component is larger than the percentage of the light of the secondary wavelength reflected by the first optical component.

2. Light emitting module according to claim 1, wherein at least one of the first optical component and the second optical component is rotatably mounted.

3. Light emitting module according to claim 1, wherein the surface structures are less than 100 um in height.

4. Light emitting module according to claim 1, wherein a top angle of the ridges is about 90 degrees.

5. Light emitting module according to claim 1, wherein the wavelength converting element is a phosphor layer on a carrier.

6. Light emitting module comprising:
at least one light emitting element which is arranged to emit light of a primary wavelength, each of the at least one light emitting element having a light emitting area;
a wavelength converting element arranged at a distance from the at least one light emitting element, the wavelength converting element being arranged to convert at least part of the light of the primary wavelength into light of a secondary wavelength; and
a first optical component being positioned such that the wavelength converting element is located between the at least one light emitting element and the first optical component,
wherein the first optical component has surface structures on a surface facing away from the at least one light emitting element,
wherein the surface structures are arranged such that light rays incident on the first optical component at angles falling inside of a predetermined incidence cone centered about a normal of the first optical component are reflected, and light rays incident on the first optical component at angles falling outside of the predetermined incidence cone are at least partially transmitted and bent towards the normal to fall inside an emission cone which is centered about an optical axis of the light emitting module, wherein the surface structures are further arranged so that the first optical component reflects light rays of ambient light incident on the first optical component on a side facing away from the light emitting element at angles falling outside of the emission cone such that the wavelength converting element is invisible from viewing angles falling outside of the emission cone.

7. Light emitting module comprising:
at least one light emitting element which is arranged to emit light of a primary wavelength, each of the at least one light emitting element having a light emitting area;
a wavelength converting element arranged at a distance from the at least one light emitting element, the wavelength converting element being arranged to convert at least part of the light of the primary wavelength into light of a secondary wavelength; and
a first optical component being positioned such that the wavelength converting element is located between the at least one light emitting element and the first optical component,
wherein the first optical component has surface structures on a surface facing away from the at least one light emitting element,
wherein the surface structures are arranged such that light rays incident on the first optical component at angles falling inside of a predetermined incidence cone centered about a normal of the first optical component are reflected, and light rays incident on the first optical component at angles falling outside of the predetermined incidence cone are at least partially transmitted and bent towards the normal to fall inside an emission cone which is centered about an optical axis of the light emitting module, wherein the wavelength converting element has a curved shape and wherein the first optical component is arranged on the wavelength converting element.

8. Light emitting module comprising:
at least one light emitting element which is arranged to emit light of a primary wavelength, each of the at least one light emitting element having a light emitting area;
a wavelength converting element arranged at a distance from the at least one light emitting element, the wavelength converting element being arranged to convert at least part of the light of the primary wavelength into light of a secondary wavelength; and
a first optical component being positioned such that the wavelength converting element is located between the at least one light emitting element and the first optical component,
wherein the first optical component has surface structures on a surface facing away from the at least one light emitting element,
wherein the surface structures are arranged such that light rays incident on the first optical component at angles falling inside of a predetermined incidence cone centered about a normal of the first optical component are reflected, and light rays incident on the first optical component at angles falling outside of the predetermined incidence cone are at least partially transmitted and bent towards the normal to fall inside an emission cone which is centered about an optical axis of the light emitting module, wherein the surface structures further are arranged such that a reflected light ray originating from an incident light ray incident on the first optical component at an angle falling inside of the incidence cone is shifted a distance with respect to the incident light ray, wherein the distance with respect to the incident light ray is larger than a geometrical extent of the light emitting area of the at least one light emitting element.

9. Light emitting module according to claim 8, wherein the smallest geometrical dimension of the surface structures is larger than the geometrical extent of the light emitting area of the at least one light emitting element.

* * * * *